United States Patent
Tsujii et al.

(10) Patent No.: US 6,519,728 B2
(45) Date of Patent: *Feb. 11, 2003

(54) SEMICONDUCTOR INTEGRATED CIRCUIT HAVING TEST CIRCUIT

(75) Inventors: Toshiyuki Tsujii, Tokyo (JP); Masahiko Hyozo, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/303,624

(22) Filed: May 3, 1999

(65) Prior Publication Data

US 2002/0194564 A1 Dec. 19, 2002

(30) Foreign Application Priority Data

Nov. 25, 1998 (JP) .............................. 10-334531

(51) Int. Cl.$^7$ ............................................. G01R 31/28
(52) U.S. Cl. ....................................... 714/727; 324/765
(58) Field of Search ...................... 714/727, 729, 714/730, 726, 724, 725; 324/73, 765, 158.1; 326/16, 21; 257/700, 690, 698, 703; 327/277, 276, 30

(56) References Cited

U.S. PATENT DOCUMENTS

| 3,806,891 A | * | 4/1974 | Eichelberger et al. ...... 714/731 |
| 4,423,959 A | * | 1/1984 | Nakazawa et al. .......... 356/400 |
| 5,627,406 A | * | 5/1997 | Pace ........................... 257/690 |
| 5,644,261 A | * | 7/1997 | Frisch et al. ................. 327/276 |
| 5,736,849 A | * | 4/1998 | Terayama ................. 324/158.1 |

FOREIGN PATENT DOCUMENTS

| JP | 54/46476 | 4/1974 | ........... H01L/32/02 |
| JP | 7/151827 | 6/1995 | ........... G01R/31/28 |

* cited by examiner

*Primary Examiner*—Albert Decady
*Assistant Examiner*—Guy Lamarre
(74) *Attorney, Agent, or Firm*—Burns, Doane, Swecker & Mathis, LLP

(57) ABSTRACT

A semiconductor integrated circuit has a test circuit in which signal pad (15) to input a switching signal TM is formed on a non-mounting surface of a LSI and one group of signal pads (11 to 13) formed on the non-mounting surface and signal pads (16 to 18) formed on a mounting surface is selected based on a signal level of the switching signal TM.

9 Claims, 3 Drawing Sheets

SEMICONDUCTOR INTEGRATED CIRCUIT HAVING TEST CIRCUIT

BACKGROUND OF THE INVENTION

1. Field of the Invention

The present invention relates to a semiconductor integrated circuit having a test circuit such as a boundary scan test circuit as an easily-testing circuit, and the semiconductor integrated circuit has one or more Large Scale Integration (LSI) formed on a printed wiring substrate, each LSI has the boundary scan circuit for executing a connection test to check the connection state among a plurality of LSI and for performing an internal test such as operation test for an internal circuit in the LSI.

2. Description of the Related Art

FIG. 1 is a diagram showing a mounted state of a semiconductor integrated circuit in which a LSI is mounted on a printed wiring substrate. In FIG. 1, the reference number 1 designates the printed wiring substrate, and 2 denotes the LSI mounted on the printed wiring substrate 1. Although FIG. 1 shows only the LSI 2 on the printed wiring substrate 1, in general, a plurality of LSI are mounted on the printed wiring substrate 1 to form a system of the semiconductor integrated circuit.

The reference number 2a designates a top surface (non-mounting surface) of the LSI 2, 2b designates a bottom surface (mounting surface) of the LSI 2, and 2c denotes a side face (non-mounting surface) of the LSI 2. The reference number 3 designates each signal pin, and 3a indicates a signal pin through which the LSI 2 inputs a clock signal TCK. The reference number 3b designates a signal pin for inputting a test mode signal TMS, 3c indicates a signal pin for inputting test data TDI, and 3d denotes a signal pin for outputting test data TDO. The reference number 4 designates each solder ball.

A description will be given of the operation of the semiconductor integrated circuit.

FIG. 2 is a circuit diagram showing a configuration of the semiconductor integrated circuit including the printed wiring substrate 1 and a plurality of LSI 2 mounted on the printed wiring substrate 1.

Ordinary, each LSI 2 is mounted on a substrate such as the printed wiring substrate 1. Like the configuration shown in FIG. 2, when a plurality of LSI 2 are mounted on the printed wiring substrate 1, the plurality of LIS 2 are connected to each other in order to realize functions to be required for the system of the semiconductor integrated circuit. In this system including the plurality of LIS 2, each LSI 2 incorporates a boundary scan circuit (IEEE 1149.1) as an easily-testing circuit in order to perform diagnosis of the connection state among the plurality of LIS 2, to execute diagnosis of the function of a single LSI 2, and the like. It is so designed that the signal pins 3a to 3d, namely electrodes, formed on the mounting surface 2b of each LSI 2 input control signals for controlling the operation of the boundary scan circuit in the LSI 2, like signals to be required for the operation of the LSI 2. Accordingly, in order to execute the diagnosis of the connection state among the plurality of LSI 2 and the function of the single LSI 2, the signal pins 3a to 3d must input signals to be used for controlling the operation of the boundary scan circuit. However, as shown in FIG. 1, the signal pins 3a to 3d in the LSI 2 are embedded into the substrate 1 after the LSI 2 has been mounted on the printed wiring substrate 1. Hence, it becomes impossible to input externally-supplied test control signals directly through the signal pins 3a to 3d. In the prior art, in order to avoid this drawback, through the TDI terminal 3c formed at edges of the printed wiring substrate 1 the test signals are supplied to the boundary scan circuit incorporated in the LSI 2.

FIG. 3 is a diagram showing test operation of a connection state among the plurality of LSI in the semiconductor integrated circuit. In FIG. 3, each of the reference characters LSI-A and LSI-B denotes a LSI.

The test method for the connection state among the plurality of LSI will be explained with reference to FIG. 3.

In the following case, both the LSI-A and the LSI-B incorporate shift registers called as the boundary scan circuits 41 and 42, respectively. These shift registers are connected in series from the TDI terminal 3c (as an input terminal) to the TDO terminal 3d (as an output terminal).

At first, optional test data are set into the boundary scan registers 41 incorporated in the LSI-A by sequentially shifting the test data provided through the TDI terminal 3c. After the setting of the test data into the boundary scan registers 41 in the LSI-A, the test data are outputted to the boundary scan registers 42 incorporated in the LSI-B and set therein. After this, the test data are sequentially shifted to the TDO terminal 3d in the printed wiring circuit 1.

Second, the test data obtained from the boundary scan registers 42 in the LSI-B through the TDO terminal 3d are compared with the test data that have been set in the boundary scan registers 41 in the LSI-A. When both agree, it can be judged that the connection state between the LSI-A and the LSI-B is correct. When both test data do not agree, it can be judged that there is any fault in the connection state between the LSI-A and the LSI-B.

FIG. 4 is a diagram showing test operation only for the LSI-B in the semiconductor integrated circuit.

A method of the operation test for the LSI will be explained with reference to the FIG. 4.

In FIG. 4, the reference number 53 designates an internal circuit in the LSI-B to be tested. Other components are the same of the components in the semiconductor integrated circuit shown in FIGS. 2 and 3. Therefore the same reference numbers are used for the same components.

When the operation test for the LSI-B is executed, at first, test data are sequentially shifted from the TDI terminal 3c to the boundary scan registers 52 in the LSI-B through the boundary scan register 51 in the LSI-A. After the set of the test data into the boundary scan register 52 in the LSI-B, the test data are outputted to the internal circuit 53 in the LSI-B. The operation of the internal circuit 53 is then executed.

After the completion of the operation of the internal circuit 53 in the LSI-B, the operation results of the internal circuit 53 are outputted to the boundary scan register 54. The results of the operation test stored in the boundary scan register 54 are sequentially shifted and outputted to an external device (omitted from FIG. 4) through the TDO terminal 3d.

Finally, the results of the operation test obtained through the TDO terminal 3d are compared with desired test data that have been prepared in advance. When both agree, it can be judged that the operation of the internal circuit 53 in the LSI-B is correct.

As shown in FIG. 3, because the conventional semiconductor integrated circuit has the configuration described above, the connection state between the LSI-A and the LSI-B can be checked by inputting test data through the TDI terminal 3c formed at edges of the printed wiring substrate 1 and for outputting the test data through the TDO terminal 3d. However, if there is any defect such as a connection defect, a structure defect in at least one of the TDI terminal 3c, the TDO terminal 3d, and the printed wiring, the test results obtained through the TDO terminal 3d cause an erroneous diagnosis or a mistaken even if the connection state between the LSI-A and the LSI-B has not any defect.

In addition to this conventional drawback, when the plurality of LSI are formed on the printed wiring substrate 1 as shown in FIG. 4, it must be required to transfer test data through the LSI-A that is not a target LSI in order to set the test data into the LSI-B as a target LSI to be tested. That is, the test data must be transferred to the target LSI-B through the LSI-A. This configuration causes the drawbacks that the operation time of the diagnosis test is increased and the setting of the test data becomes complicated.

Further, when a breaking of the wiring or a faulty solder happen, there is a drawback that the diagnosis test for the connection state among a plurality of LIS and the diagnosis test only for a LSI can not be executed.

SUMMARY OF THE INVENTION

Accordingly, an object of the present invention is, with due consideration to the drawbacks of the conventional technique, to provide a semiconductor integrated circuit having a test circuit capable of directly inputting control signals therein in order to control the operation of boundary scan circuits in a LSI as a target to be tested in the semiconductor integrated circuit, not through printed wiring.

In accordance with a preferred embodiment of the present invention, a semiconductor integrated circuit having a test circuit mounted on a printed wiring substrate in which one or more LSI, each LSI incorporating a boundary scan circuit. The semiconductor circuit comprises first input means formed on both a mounting surface and non-mounting surface of the LSI for inputting control signals and test data to be used for the boundary scan test, second input means for inputting a switching signal by which one of a group of the first input means formed on the non-mounting surface and a group of the first input means formed on the mounting surface is selected, and connection means for electrically connecting the boundary scan circuit to the first input means in the selected group according to the switching signal inputted through the second input means.

In the semiconductor integrated circuit having a test circuit as another preferred embodiment according to the present invention, the second input means is formed on the non-mounting surface of the LSI.

In the semiconductor integrated circuit having a test circuit as another preferred embodiment according to the present invention, the second input means is formed on the mounting surface of the LSI.

In the semiconductor integrated circuit having a test circuit as another preferred embodiment according to the present invention, the first input means and the second input means are signal pads.

In the semiconductor integrated circuit having a test circuit as another preferred embodiment according to the present invention, the first input means and the second input means are signal pins, each having a projecting shaped.

In the semiconductor integrated circuit having a test circuit as another preferred embodiment according to the present invention, the non-mounting surface is an opposite surface and side surfaces with respect to the surface of the LSI faced to the printed wiring surface.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 5:
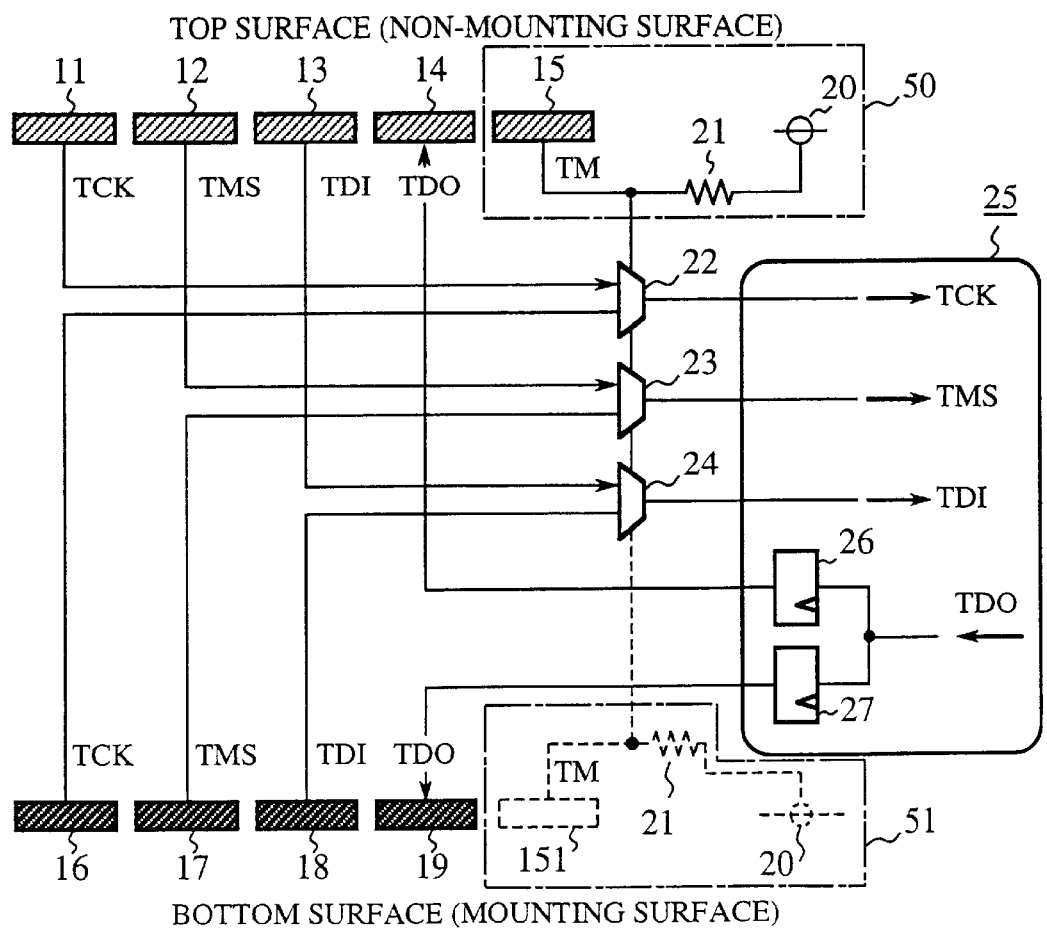
FIG. 5 is a diagram showing an internal configuration of a semiconductor integrated circuit having a test circuit as first to third embodiments according to the present invention.

FIG. 5 is a diagram showing an internal configuration of a semiconductor integrated circuit having a test circuit as first to third embodiments according to the present invention. FIG. 5 shows only a part of the semiconductor integrated circuit as a LSI mounted on a printed wiring substrate. In FIG. 5, the reference number 11 designates a signal pad formed on a top surface of the LSI for inputting a clock signal CLK that is used for a boundary scan test. The reference number 12 denotes a signal pad formed on the top surface of the LSI for inputting a test mode signal TMS to be used for the boundary scan test. The reference number 13 indicates a signal pad formed on the top surface of the LSI for inputting test data TDI to be used for the boundary scan test. The reference number 14 designates a signal pad formed on the top surface of the LSI for outputting test data TDO. The reference number 15 in a block 50 designates a signal pad formed on the top surface of the LSI for inputting a switching signal TM to be used for the boundary scan test.

Further, as shown in FIG.5, the reference number 16 designates a signal pad formed on a bottom surface of the LSI for inputting the clock signal TCK to be used for the boundary scan test. The reference number 17 denotes a signal pad formed on the bottom surface of the LSI for inputting the test mode signal TMS to be used for the boundary scan test. The reference number 18 indicates a signal pad formed on the bottom surface of the LSI for inputting test data TDI to be used for the boundary scan test. The reference number 19 designates a signal pad formed on the bottom surface of the LSI for outputting test data TDO. The reference number 151 in a block 51 designates a signal pad formed on the bottom surface of the LSI for inputting the switching signal TM to be used for the boundary scan test.

The reference number 20 designates a power source, and 21 denotes a resistance. The reference number 22 indicates a selector for selecting one of the clock signal TCK from both the signal PAD 11 and the signal PAD 16 according to the signal level of the switching signal TM. The reference number 23 designates a selector for selecting one of the test mode signal TMS from both the signal PAD 12 and the signal PAD 17 according to the signal level of the switching signal TM. The reference number 24 indicates a selector for selecting one of the test data TDI from both the signal PAD 14 and the signal PAD 19 according to the signal level of the switching signal TM. The reference number 25 designates a boundary scan circuit in the LSI to be used for the test of a connection state between a plurality of LSI and a diagnosis test of operation of the LSI, for example. The reference number 26 indicates a latch circuit for latching the test data TDO as results of test operation of the boundary scan circuit 25 and for outputting the test data TDO to the signal PAD 14. The reference number 27 denotes a latch circuit for latching the test data TDO as the results of the test operation of the boundary scan circuit 25 and for outputting the test data TDO to the signal PAD 19.

A description will be given of the operation of the semiconductor integrated circuit having a test circuit according to the first embodiment.

When the switching signal TM of a high (H) level is input through the signal PAD 15 formed on the top surface (non-mounting surface) of the LSI, the selectors 22 to 24 operate so that the boundary scan circuit 25 may use the signals such as the clock signal TCK, the test mode signal TMS, the test data TDI transferred through the PADs 16 to 18. In this situation, the selectors 22 to 24 halt to enter the signals from the PADS 11 to 13.

Figure 1:
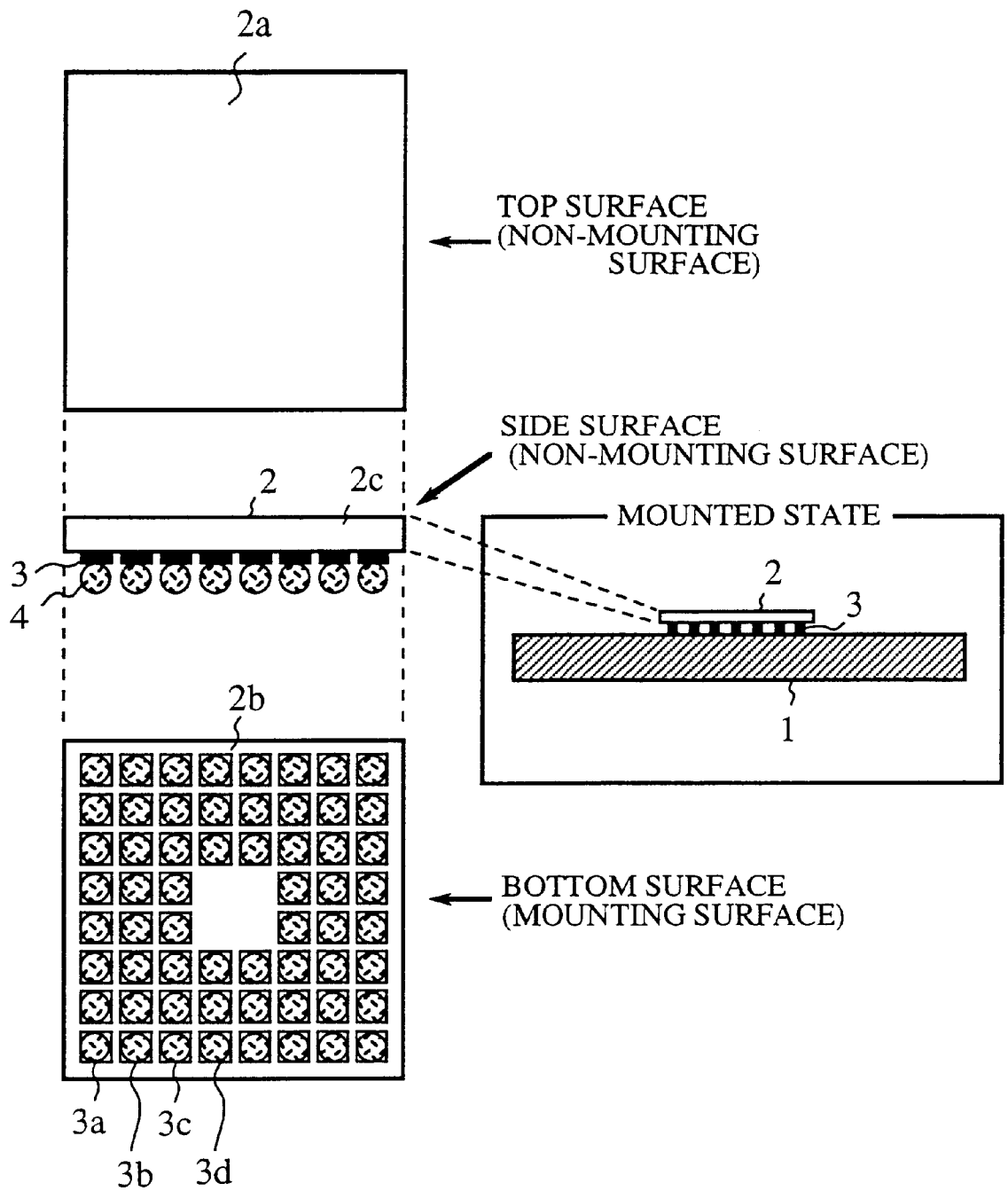
FIG. 1 is a diagram showing a mounted state of a semiconductor integrated circuit in which a LSI is mounted on a printed wiring substrate.
Figure 2:
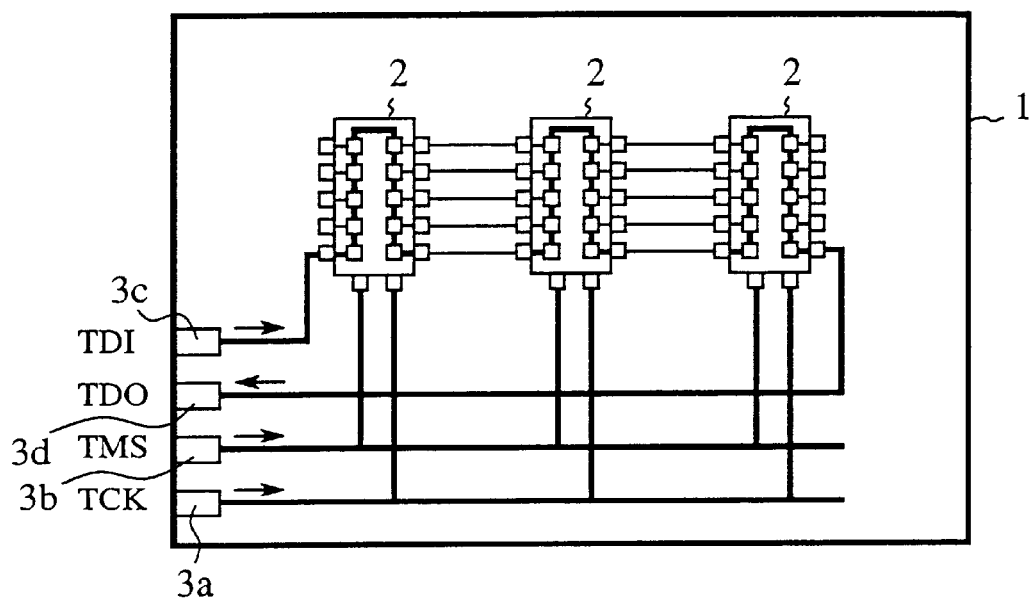
FIG. 2 is a circuit diagram showing a configuration of a semiconductor integrated circuit forming a printed wiring substrate and a plurality of LSI mounted on the printed wiring substrate.
Figure 3:
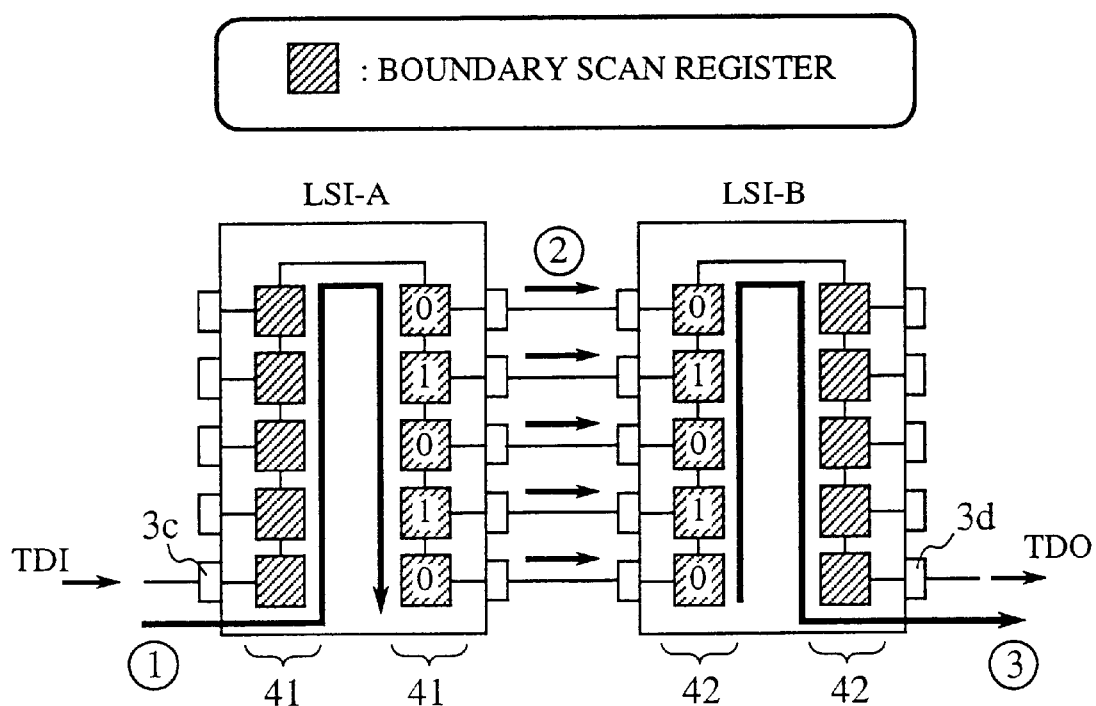
FIG. 3 is a diagram showing test operation of a connection state among the plurality of LSI in a semiconductor integrated circuit.
Figure 4:
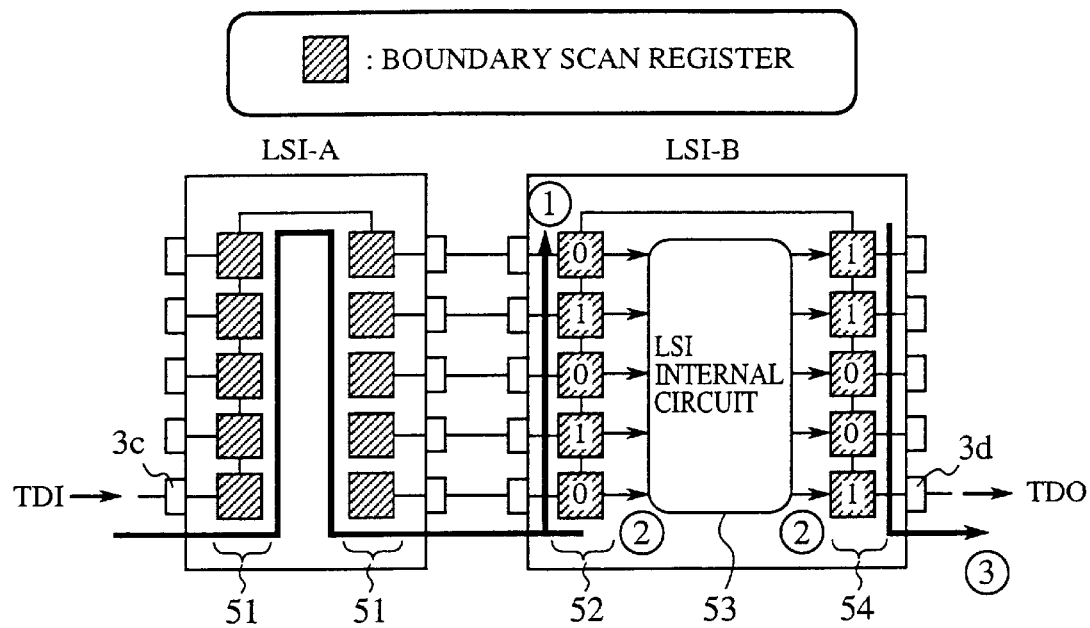
FIG. 4 is a diagram showing test operation for a LSI in a semiconductor integrated circuit.

In this case, if the test data TDI and control signals are input from the signal pads 16 to 18 through input terminals (not shown) formed at edges of the printed wiring substrate 1 shown in FIG. 1 according to the level of the switching signal TM, it becomes possible to perform the connection test among the plurality of LSI by using the same manner of the conventional semiconductor integrated circuit.

Further, the test results TDO of the boundary scan circuit 25 are outputted to the signal PADs 14 and 19 from the latch circuits 26 and 27.

On the other hand, when the switching signal TM of a low (L) level is input through the signal PAD 15 formed on the top surface (non-mounting surface) of the LSI, the selectors 22 to 24 operate so that the boundary scan circuit 25 may use the signals such as the clock signal TCK, the test mode signal TMS, test data TDI transferred through the PADs 11 to 13. In this situation, the selectors 22 to 24 halt to enter the signals from the PADs 16 to 18.

In this case, when the test data TDI, the timing clock signal TCK, and the test mode signal TMS are directly input to the boundary scan circuit 25 in the LSI through the signal pads 11 to 13 formed on the top surface (non-mounting surface) of the LSI, not through the pads 16 to 18 formed on the bottom surface (mounting surface) and not through the input terminals (not shown) formed at edges of the printed wiring substrate, it becomes possible to perform the connection test among the plurality of LSI. Further, the test results TDO of the boundary scan circuit 25 are outputted to the signal PADs 14 and 19 from the latch circuits 26 and 27.

In the above explanation, the signal PADs 11 to 15 are formed on the top surface (non-mounting surface) of the LSI, but the present invention is not limited by this configuration, it is possible to form the signal PADs 11 to 15 on side surfaces 2c (as non-mounting surface shown in FIG. 1) of the LSI.

As described above, the semiconductor integrated circuit having a test circuit as the first embodiment has the following configuration: the signal PAD 15 for receiving the switching signal TM is also formed on the top surface (non-mounting surface) of the LSI; one of the group of the signal PADs 11 to 13 formed on the top surface (non-mounting surface) and the group of the signal PADs 16 to 18 formed on the bottom surface (mounting surface) of the LSI is selected by the selectors 22 to 24 according to the signal level of the switching signal TM and are then connected to the boundary scan circuit 25 based on the selection state. Hence, for example, it is possible to input the control signals and the test data directly to the boundary scan circuit 25 in the LSI as a target to be tested, through the signal PADs 11 to 13, not through the PADs 16 to 18 connected to the printed wiring formed on the printed wiring substrate 1. As a result, it is achieved to prevent any occurrence of error diagnosis of the connection state among the plurality of LSI and it is possible to prepare an operation test of the LSI easily with a high speed. In addition to this feature, when the level of the switching signal TM is changed to the H level, it becomes possible to input the test data TDI through input terminal formed at an edge of the printed wiring substrate 1. This case may perform the same test operation of the conventional semiconductor integrated circuit.

Second Embodiment

In the first embodiment, the signal PAD 15 to input the switching signal TM is formed on the top surface (non-mounting surface) shown by the block 50. However, the present invention is not limited by this configuration, for example, it is also possible to form the signal PAD 151 for inputting the switching signal TM on the bottom surface (mounting surface) of the LSI, shown by the block 51 in FIG. 5.

In this configuration of the second embodiment, the switching signal TM must be input through an input terminal formed at an edge of the printed wiring substrate 1 and through printed wiring.

As described above, according to the second embodiment, the semiconductor integrated circuit having a test circuit, the signal pad 151 through which the switching signal TM is input is formed on the bottom surface (mounting surface) of the LSI, shown in the block 51 in FIG. 1, one of the group of the signal PADs 11 to 13 formed on the top surface (non-mounting surface) and the group of the signal PADS 16 to 18 formed on the bottom surface (mounting surface) of the LSI is selected by the selectors 22 to 24 according to the signal level of the switching signal TM obtained through the signal pad 151 and the printed wiring in order to connect the signal PADS in the selected group to the boundary scan circuit 25. Hence, it is possible to perform the test of the semiconductor integrated circuit.

Third embodiment

In both the first and second embodiments, the signal PADS 11 to 19, and 151 as described above in detail are formed on both the top surface (non-mounting surface) and the bottom surface (mounting surface) of the LSI. However, the present invention is not limited by those configurations, for example, it is possible to use signal pins instead of those signal pads 11 to 15, each signal pin has a projecting shaped. Hence, there is a effect that it i s easily possible to connect an external test device (omitted from drawings) to the LSI as a semiconductor integrated circuit to be tested by using clips, in addition to the effects of the first and second embodiments. This configuration of the third embodiment may achieve easy-preparation for the test operation.

As described above in detail, according to the present invention, the semiconductor integrated circuit having a test circuit has the configuration that the signal pad to input the switching signal TM is formed on the non-mounting surface of a LSI, and one of the signal pads formed on both the non-mounting surface and the mounting surface is selected according to the switching signal TM in order to connect the selected signal pads to the boundary scan circuit in the LSI. This configuration achieves to prevent any error diagnosis caused during the test operation of the connection state among a plurality of LSI formed on the printed wiring substrate. In addition to this feature, it is possible to prepare an operation test of the LSI easily with high speed.

In addition, according to the present invention, the semiconductor integrated circuit having a test circuit has the configuration that the signal pad to input the switching signal TM is formed on the mounting surface of a LSI, and one of the signal pads formed on both the non-mounting surface and the mounting surface is selected according to the switching signal TM in order to connect the selected signal pads to the boundary scan circuit in the LSI. This configuration achieves to prevent any error diagnosis caused during the test operation of the connection state among a plurality of LSI formed on the printed wiring substrate. In addition to this feature, it is possible to prepare an operation test of the LSI easily with high speed.

Furthermore, according to the present invention, the semiconductor integrated circuit having a test circuit has the configuration that the signal pins of a projecting shaped to input the switching signal TM is formed on the non-mounting surface of a LSI, and one of the signal pins of a projecting shaped formed on both the non-mounting surface and the mounting surface is selected according to the switching signal TM in order to connect the selected signal pads to the boundary scan circuit in the LSI. This configuration achieves to prevent any error diagnosis caused during the test operation of the connection state among a plurality of LSI formed on the printed wiring substrate. In addition to this feature, it is possible to prepare an operation test of the LSI easily with high speed.

Moreover, according to the present invention, the semiconductor integrated circuit having a test circuit has the configuration that the signal pins of a projecting shaped to input the switching signal TM is formed on the mounting surface of a LSI, and one of the signal pins of a projecting shaped formed on both the non-mounting surface and the mounting surface is selected according to the switching signal TM in order to connect the selected signal pads to the boundary scan circuit in the LSI. This configuration achieves to prevent any error diagnosis caused during the test operation of the connection state among a plurality of LSI formed on the printed wiring substrate. In addition to this feature, it is possible to prepare an operation test of the LSI easily with high speed.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit having a test circuit mounted on a printed wiring substrate in which one or more LSI, each LSI incorporating a boundary scan circuit, comprising:

first input means formed on both a mounting surface and non-mounting surface of said LSI for inputting control signals and test data to be used for said boundary scan test;

second input means for inputting a switching signal by which one of a group of the first input means formed on the non-mounting surface and a group of the first input means formed on said mounting surface is selected; and connection means for electrically connecting said boundary scan circuit to said first input means in said selected group according to said switching signal inputted through said second input means, wherein said non-mounting surface is an opposite surface and side surfaces with respect to said surface of said LSI faced to said printed wiring surface.

2. A semiconductor integrated circuit having a test circuit according to claim 1, wherein said second input means is formed on said non-mounting surface of said LSI.

3. A semiconductor integrated circuit having a test circuit according to claim 2, wherein said first input means and said second input means are signal pads.

4. A semiconductor integrated circuit having a test circuit according to claim 2, wherein said first input means and said second input means are signal pins, each having a projecting shaped.

5. A semiconductor integrated circuit having a test circuit according to claim 1, wherein said second input means is formed on said mounting surface of said LSI.

6. A semiconductor integrated circuit having a test circuit according to claim 5, wherein said first input means and said second input means are signal pads.

7. A semiconductor integrated circuit having a test circuit according to claim 5, wherein said first input means and said second input means are signal pins, each having a projecting shaped.

8. A semiconductor integrated circuit having a test circuit according to claim 1, wherein said first input means and said second input means are signal pads.

9. A semiconductor integrated circuit having a test circuit according to claim 1, wherein said first input means and said second input means are signal pins, each having a projecting shaped.

* * * * *